(12) United States Patent
Ma

(10) Patent No.: US 11,616,109 B2
(45) Date of Patent: Mar. 28, 2023

(54) DISPLAY PANEL AND DISPLAY DEVICE

(71) Applicant: Wuhan Tianma Micro-Electronics Co., Ltd., Wuhan (CN)

(72) Inventor: Yangzhao Ma, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/494,643

(22) Filed: Oct. 5, 2021

(65) Prior Publication Data

US 2022/0028950 A1    Jan. 27, 2022

(30) Foreign Application Priority Data

Apr. 1, 2021    (CN) .......................... 202110358179.8

(51) Int. Cl.
| | |
|---|---|
| *H10K 59/126* | (2023.01) |
| *H10K 50/813* | (2023.01) |
| *H10K 50/822* | (2023.01) |
| *H04N 23/90* | (2023.01) |
| *H04N 5/265* | (2006.01) |
| *H01L 27/32* | (2006.01) |
| *H01L 51/52* | (2006.01) |

(52) U.S. Cl.
CPC ...... *H01L 27/3272* (2013.01); *H01L 51/5209* (2013.01); *H01L 51/5225* (2013.01); *H04N 5/265* (2013.01); *H04N 23/90* (2023.01)

(58) Field of Classification Search
None
See application file for complete search history.

(56) References Cited

U.S. PATENT DOCUMENTS

| | | | | |
|---|---|---|---|---|
| 2021/0334504 | A1* | 10/2021 | Lu ...................... | G06V 40/1318 |
| 2022/0238620 | A1* | 7/2022 | Liu ........................ | H01L 27/02 |

FOREIGN PATENT DOCUMENTS

| | | | | |
|---|---|---|---|---|
| CN | 108922469 A | 11/2018 | | |
| CN | 110489580 A | 11/2019 | | |
| WO | WO-2022037055 A1 * | 2/2022 | ........... | G06F 3/0412 |
| WO | WO-2022042041 A1 * | 3/2022 | | |

* cited by examiner

*Primary Examiner* — Duane N Taylor, Jr.
(74) *Attorney, Agent, or Firm* — Alston & Bird LLP

(57) ABSTRACT

Provided are a display panel and a display device. The display panel includes an optical component area and a conventional display area. A base substrate includes multiple pixels, and each pixel includes a light-emitting device and a pixel driving circuit which is electrically connected to the light-emitting device. The light-emitting devices includes first light-emitting devices and second light-emitting devices. The conventional display area is provided with the first light-emitting devices; and the optical component area is provided with the second light-emitting devices. The optical component area includes a first optical component area and a second optical component area. The first optical component area includes a first light-transmitting area and multiple first light-shielding areas. The second optical component area includes a second light-transmitting area and multiple second light-shielding areas. The first light-shielding areas do not have an edge parallel to an edge of the second light-shielding areas.

20 Claims, 11 Drawing Sheets

DISPLAY PANEL AND DISPLAY DEVICE

CROSS-REFERENCE IO RELATED APPLICATION

This application claims priority to Chinese Patent Application No. 202110358179.8 filed with the CNIPA on Apr. 1, 2021, the disclosure of which is incorporated herein by reference in its entirety.

TECHNICAL FIELD

The present disclosure relates to the field of display technologies and, in particular, to a display panel and a display device.

BACKGROUND

Nowadays, the development of display technology changes quickly, and the emergence of various screen technologies provides infinite possibilities for electronic terminals. Especially, the display technology represented by organic light-emitting diode (OLED) has been applied rapidly, and various mobile terminals with selling points such as "full screen", "special-shaped screen", "under-screen sound" and "under-screen fingerprint" are promoted rapidly.

Major mobile phone and panel manufacturers have launched many products with "full screen" as the selling point, and since the mobile terminal has a front-facing camera, to solve the problem that the front-facing camera occupies the display area, technicians have developed a technology in which the display interface is completely covered by the display screen; that is, the photosensitive element is designed to be under the display screen. Although the existing display panel with the under-screen photosensitive element has an increased screen-to-body ratio, the imaging effect of the photosensitive element is poor.

SUMMARY

The present disclosure provides a display panel and a display device for enhancing the imaging effect of the photosensitive element area of the display panel.

In a first aspect, the present disclosure provides a display panel. The display panel includes a display area and a base substrate. The display area includes an optical component area and a conventional display area.

The base substrate includes multiple pixels, and each of the multiple pixels includes a light-emitting device and a pixel driving circuit which is electrically connected to the light-emitting device. The light-emitting device is provided with an anode, a light-emitting layer and a cathode disposed sequentially in a direction away from the base substrate.

Light-emitting devices of the multiple pixels include first light-emitting devices and second light-emitting devices. The conventional display area is provided with the first light-emitting devices arranged in an array. The optical component area is provided with the second light-emitting devices arranged in an array.

The optical component area includes a first optical component area and a second optical component area. The first optical component area includes a first light-transmitting area and multiple first light-shielding areas. A vertical projection of each first light-shielding area on a plane where the base substrate is located covers at least one second light-emitting device. The second optical component area includes a second light-transmitting area and multiple second light-shielding areas. A vertical projection of each second light-shielding area on the plane where the base substrate is located covers at least one second light-emitting device.

The first light-shielding areas in the first optical component area do not have an edge parallel to an edge of the second light-shielding areas in the second optical component area.

In a second aspect, the present disclosure further provides a display panel. The display panel includes a display area and a base substrate. The display area includes an optical component area and a conventional display area.

The base substrate includes multiple pixels, and each of the multiple pixels includes a light-emitting device and a pixel driving circuit which is electrically connected to the light-emitting device. The light-emitting device is provided with an anode, a light-emitting layer and a cathode disposed sequentially in a direction away from the base substrate.

The light-emitting devices include first light-emitting devices and second light-emitting devices. The conventional display area is provided with the first light-emitting devices arranged in an array. The optical component area is provided with the second light-emitting devices arranged in an array.

The optical component area includes a first optical component area and a second optical component area. The first optical component area includes multiple first light-transmitting areas. A vertical projection of each first light-transmitting area on a plane where the base substrate is located is located in a gap between two adjacent ones of the multiple pixels in the first optical component area. The second optical component area includes multiple second light-transmitting areas. A vertical projection of each second light-transmitting area on the plane where the base substrate is located is located in a gap between two adjacent ones of the multiple pixels in the second optical component area.

The vertical projections of the multiple first light-transmitting areas on the plane where the base substrate is located do not have an edge parallel to an edge of the vertical projections of the multiple second light-transmitting areas on the plane where the base substrate is located.

In a third aspect, the present disclosure also provides a display device. The display device includes the display panel in any one of the embodiments of the present disclosure.

The display device also includes a first camera, a second camera and a signal processing chip. The first camera is configured to be disposed on a side of a base substrate facing away from multiple pixels. A vertical projection of the first camera on the base substrate is located within the first optical component area, and the first camera is configured to capture first image information. The first image information has a diffraction direction along a first direction, and loses a first part of image information in the first direction.

The second camera is disposed on the side of the base substrate facing away from the plurality of pixels. A vertical projection of the second camera on the base substrate is located within the second optical component area, and the second camera is configured to capture second image information. A diffraction direction of the second image information intersects with the first direction.

The signal processing chip is configured to extract a first part of image information of the second image information in the first direction, and superimpose the first part of image information on the first image information to form complete image information.

DETAILED DESCRIPTION

Figure 1:
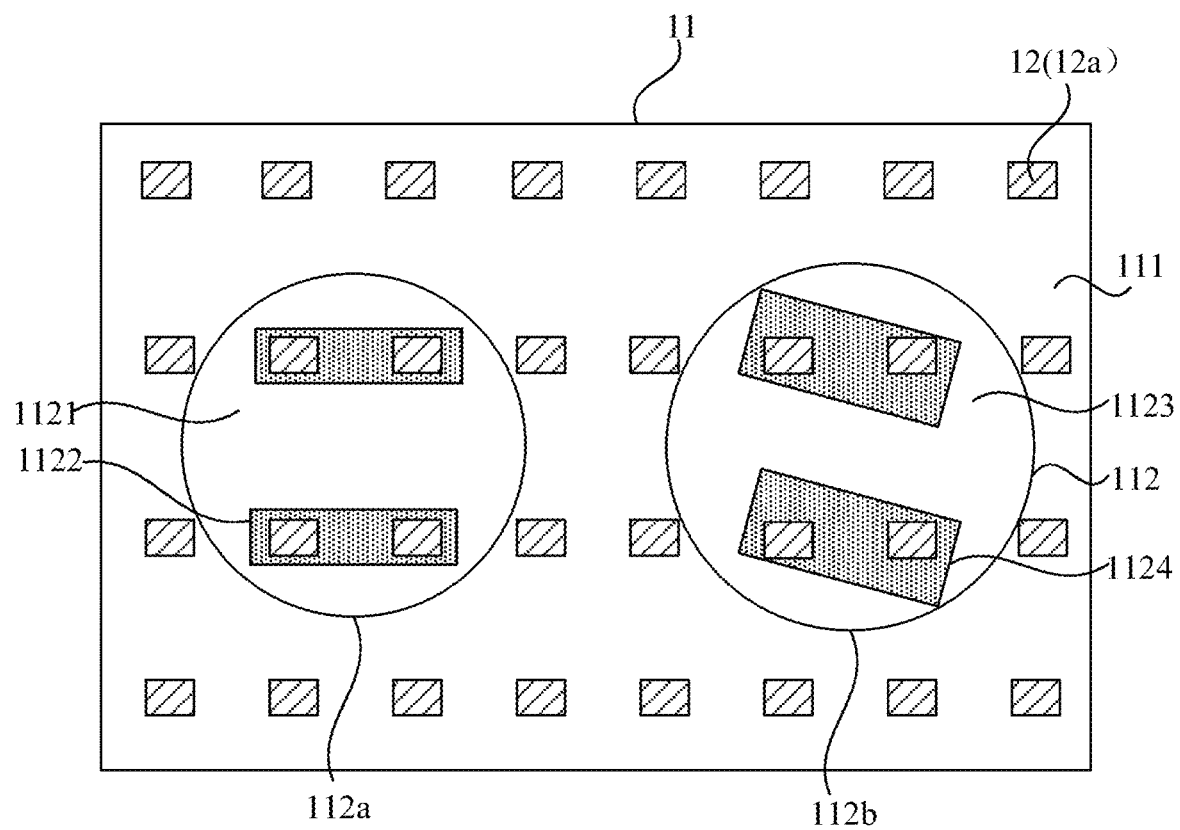
FIG. 1 is a structure diagram of a display panel provided by an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

An embodiment of the present disclosure provides a display panel. The display panel includes a display area and a base substrate. The display area includes an optical component area and a conventional display area.

The base substrate includes multiple pixels, and each pixel includes a light-emitting device and a pixel driving circuit which is electrically connected to the light-emitting device. The light-emitting device is provided with an anode, a light-emitting layer and a cathode disposed sequentially in a direction away from the base substrate.

Light-emitting devices of the multiple pixels include first light-emitting devices and second light-emitting devices. The conventional display area is provided with the first light-emitting devices arranged in an array. The optical component area is provided with the second light-emitting devices arranged in an array.

The optical component area includes a first optical component area and a second optical component area. The first optical component area includes a first light-transmitting area and multiple first light-shielding areas. A vertical projection of each first light-shielding area on a plane where the base substrate is located covers at least one second light-emitting device. The second optical component area includes a second light-transmitting area and multiple second light-shielding areas. A vertical projection of each second light-shielding area on the plane where the base substrate is located covers at least one second light-emitting device.

The first light-shielding areas in the first optical component area do not have an edge parallel to an edge of the second light-shielding areas in the second optical component area.

In embodiments of the present disclosure, the display panel includes the base substrate and multiple pixels disposed on the base substrate. Each pixel includes the light-emitting device and the pixel driving circuit which is electrically connected to the light-emitting device. The light-emitting devices of the multiple pixels include the first light-emitting devices and the second light-emitting devices. The first light-emitting devices are disposed in the conventional display area and the second light-emitting devices are disposed in the optical component area. The optical component area includes the first optical component area and the second optical component area. The first optical component area includes the first light-transmitting area and multiple first light-shielding areas. Similarly, the second optical component area includes the second light-transmitting area and multiple second light-shielding areas. The vertical projection of each first light-shielding area on the plane where the base substrate is located covers at least one second light-emitting device. The vertical projection of each second light-shielding area on the plane where the base substrate is located covers at least one second light-emitting device. The first light-shielding areas do not have an edge parallel to an edge of the second light-shielding areas. A light diffraction phenomenon occurs between the light-shielding area and the light-transmitting area and causes the imaging loss of the optical component. In embodiments of the present disclosure, the first light-shielding area does not have an edge parallel to an edge of the second light-shielding area, and thus the light diffraction direction in the first optical component area is different from the light diffraction direction in the second optical component area. Images with different imaging losing information are obtained in the first optical component area and the second optical component area respectively by different optical components, thus complete imaging information is obtained according to the different optical components, and the imaging quality of the optical component area is finally improved.

The above are examples of embodiments of the present disclosure, and technical solutions in embodiments of the present disclosure will be described clearly and completely in conjunction with the drawings in embodiments of the present disclosure. Based on embodiments of the present disclosure, variations are within the scope of the present disclosure.

Figure 2:
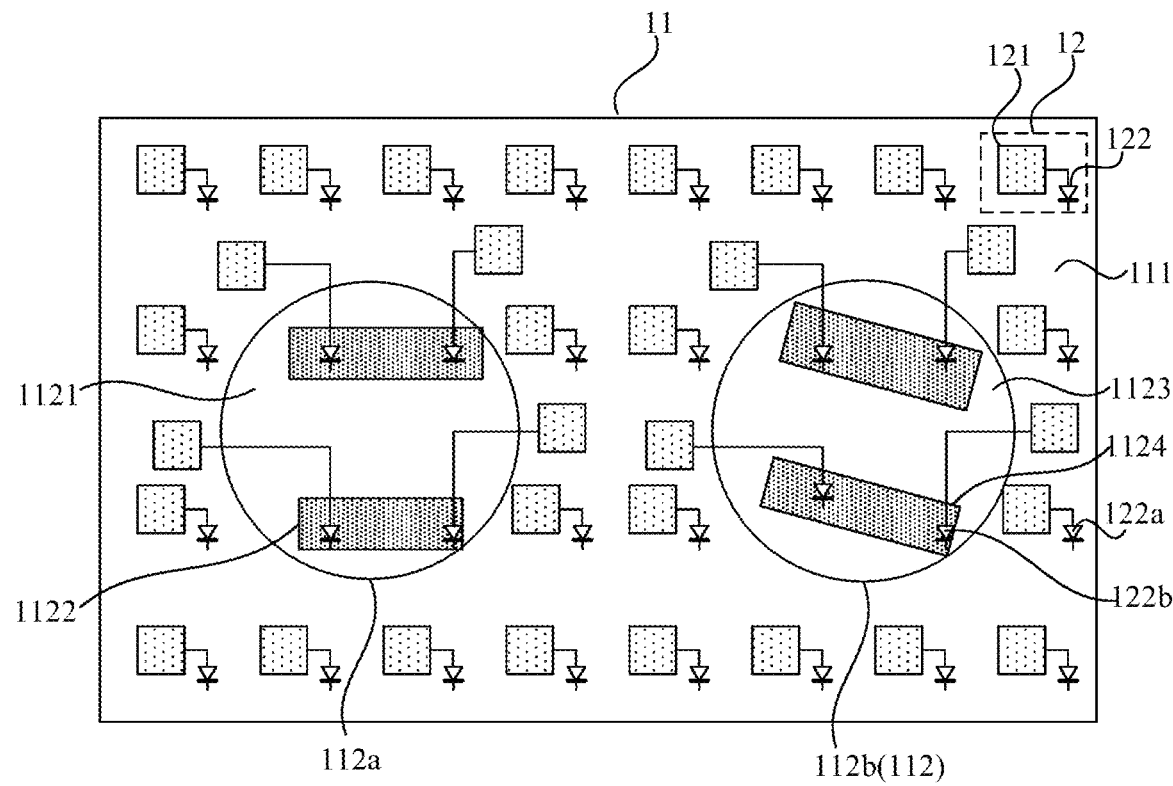
FIG. 2 is a structure diagram of another display panel provided by an embodiment of the present disclosure.

FIG. 1 is a structure diagram of a display panel provided by an embodiment of the present disclosure. FIG. 2 is a structure diagram of another display panel provided by an embodiment of the present disclosure. As shown in FIG. 1, the display panel includes a base substrate 11, and multiple pixels 12 disposed on the base substrate 11. As shown in FIG. 2, each multiple pixel 12 includes a light-emitting device 122 and a pixel driving circuit 121 which is electrically connected to the light-emitting device. The light-emitting device 122 includes an anode 12a, a light-emitting layer (not shown in FIGS. 1 and 2) and a cathode (not shown in FIGS. 1 and 2) which are sequentially disposed facing away from the base substrate 11. It is to be noted that FIG. 1 shows a general arrangement of the multiple pixels 12 on the display panel mainly by a shape of the anode 12a, while FIG. 2 shows an arrangement of the light-emitting devices 122 and the pixel driving circuits 121 in the pixels 12 mainly by a simplified pattern.

Figure 3:
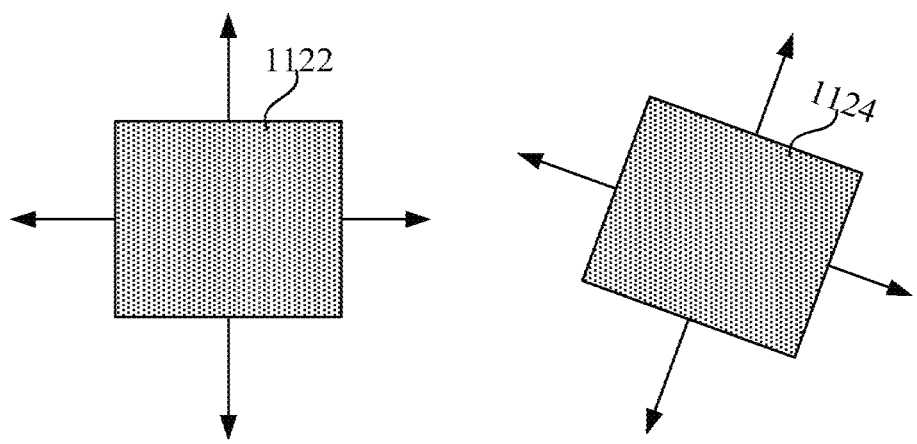
FIG. 3 is a schematic diagram showing a light diffraction principle provided by an embodiment of the present disclosure.

In a plane where the display panel is located, the display panel includes a display area. The display area includes a conventional display area 111 and an optical component area 112. The light-emitting devices 122 of the multiple pixels 12 include first light-emitting device 122a and second light-emitting devices 122b, and the conventional display area 111 is provided with the first light-emitting devices 122a arranged in an array, and the optical component area 112 is provided with the second light-emitting devices 122b arranged in an array. Referring to FIG. 1, the optical component area 112 includes a first optical component area 112a and a second optical component area 112b. The first optical component area 112a includes a first light-transmitting area 1121 and multiple first light-shielding areas 1122; and the second optical component area 112b includes a second light-transmitting area 1123 and multiple second light-shielding areas 1124. A vertical projection of each first light-shielding area 1122 on a plane where the base substrate 11 is located covers at least one second light-emitting device 122b; and a vertical projection of each second light-shielding area 1124 on the plane where the base substrate 11 is located covers at least one second light-emitting device 122b. External light passing through the first optical component area 112a enters an optical component by the first light-transmitting area 1121 between adjacent first light-shielding areas 1122, and external light passing through the second optical component area 112b enters an optical component by the first light-transmitting area 1121 between adjacent second light-shielding areas 1124. Light diffraction may occur at a boundary line between the light-shielding area and the light-transmitting area. As shown in FIG. 3, FIG. 3 is a schematic diagram showing a light diffraction principle provided by an embodiment of the present disclosure. Light is diffracted in a direction perpendicular to an edge of the light-shielding area, resulting in that there is an information loss in imaging in the optical component area in the diffraction direction. In this embodiment, the first light-shielding area 1122 does not have an edge parallel to an edge of the second light-shielding area 1124, and thus losing information in imaging in the first optical component area 112a is different from losing information in imaging of the second optical component area 112b. One image having complete information can be obtained according to the imaging in the first optical component area 112a and the imaging in the second optical component area 112b, and the imaging quality of the optical component is improved. In this embodiment, the optical component for imaging may be a component such as a camera, a viewfinder, or an optical sensor, which is not limited in this embodiment.

The shapes of the light-shielding areas may be at least one of a regular triangle, a rectangle, a parallelogram, a regular pentagon, a regular hexagon or a trapezoid. In this embodiment, the shapes of the first light-shielding areas 1122 and the shapes of the second light-shielding areas 1124 may both include at least one of a regular triangle, a rectangle, a parallelogram, a regular pentagon, a regular hexagon, and a trapezoid. Exemplarily, as shown in FIGS. 1 to 3, the shapes of the first light-shielding areas 1122 and the shapes of the second light-shielding areas 1124 may both be a rectangle or a rounded rectangle. It will be appreciated that the shapes of the first light-shielding area 1122 may be different from the shapes of the second light-shielding areas 1124, or the first light-shielding areas 1122 may include at least two shapes, and the second light-shielding areas 1124 may also include at least two shapes. The first light-shielding areas 1122 and the second light-shielding areas 1124 in this embodiment may be in other regular or irregular shapes, which is not limited in this embodiment.

Figure 4:
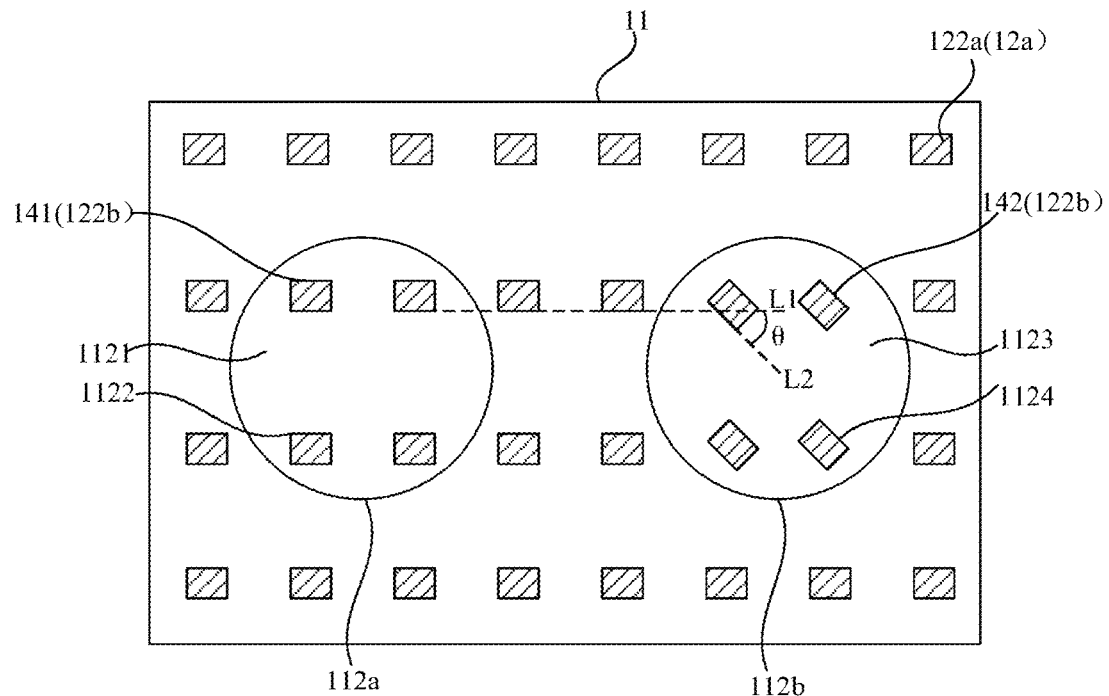
FIG. 4 is a structure diagram of another display panel provided by an embodiment of the present disclosure.

The light-shielding area may be composed of a light-shielding structure, and the light-shielding structure may be disposed in the display panel. On a plane parallel to the base substrate 11, each light-shielding structure covers at least one second light-emitting device 122b. FIG. 4 is a structure diagram of another display panel provided by an embodiment of the present disclosure. The first light-shielding area may include a first light-shielding structure 141. An anode 12a of the second light-emitting device 122b in the first optical component area 112a is multiplexed as the first light-shielding structure 141. A vertical projection of the first light-shielding structure 141 on the plane where the base substrate 11 is located covers one first light-emitting device 122b. The second light-shielding area includes a second light-shielding structure 142. An anode 12a of the second light-emitting device 122b in the second optical component area 112b is multiplexed as the second light-shielding structure 142. A vertical projection of the second light-shielding structure 142 on the plane where the base substrate 11 is located covers one second light-emitting device 122b. The anode 12a of the second light-emitting device 122b in the first optical component area 112a does not have an edge parallel to an edge of the anode 12a of the second light-emitting device 122b in the second optical component area 112b.

The light-emitting device includes an anode, a light-emitting layer, and a cathode which are sequentially disposed. A material of the anode may be an opaque metal material. In this embodiment, the anode 12a is multiplexed as the light-shielding structure. Specifically, the anode 12a of the second light-emitting device 122b in the first optical component area 112a is multiplexed as the first light-shielding structure 141, each first light-shielding structure 141 merely corresponds to one second light-emitting device 122b, and the first light-shielding structure 141 covers the light-emitting layer of the second light-emitting device 122b, that is, the first light-shielding structure 141 covers the corresponding second light-emitting device 122b. Similarly, the anode 12a of the second light-emitting device 122b in the second optical component area 112b is multiplexed as the second light-shielding structure 142, and the second light-shielding structure 142 covers one corresponding second light-emitting device 122b. In this embodiment, the anode 12a is multiplexed as the light-shielding structure, thereby reducing the panel preparation process and effectively saving the panel preparation cost. It should be noted that, the first light-shielding structure 141 (the anode 12a) in the first optical component area 112a does not have an edge parallel to an edge of the second light-shielding structure 142 (the anode 12a) in the second optical component area 112b, thereby ensuring that a light diffraction direction in the first optical component area 112a is different from a light diffraction direction in the second optical component area 112b, and thus imaging losing information in the first optical component area 112a may be obtained by the imaging of the second optical component area 112b, or imaging losing information in the second optical component area 112b may be obtained by the imaging in the first optical component area 112a, thereby obtaining clear and complete imaging information and improving the shooting quality of the optical component.

Figure 5:
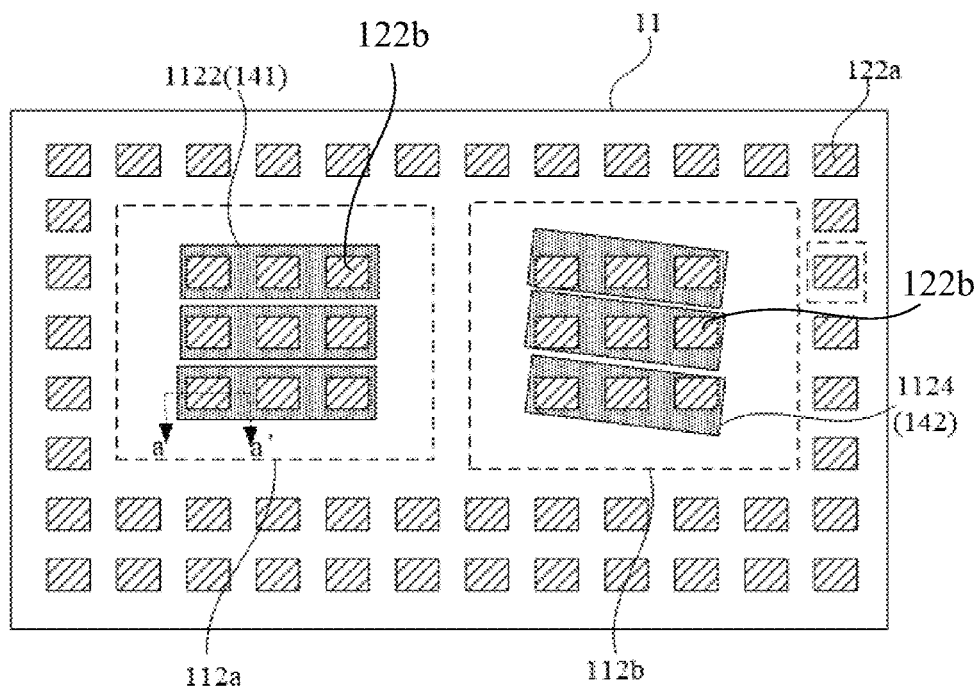
FIG. 5 is a structure diagram of another display panel provided by an embodiment of the present disclosure.

It will be appreciated that a layer of light-shielding structure may be additionally provided in the display panel to achieve that the light-shielding structure covers at least one light-emitting device in the plane parallel to the base substrate 11. FIG. 5 is a structure diagram of another display panel provided by an embodiment of the present disclosure. A first light-shielding area 1122 may include a first light-shielding structure 141, and a second light-shielding area 1124 includes a second light-shielding structure 142. A vertical projection of the first light-shielding structure 141 on a plane where a base substrate 11 is located covers at least one second light-emitting device 122b, and a vertical projection of the second light-shielding structure 142 on the plane where the base substrate is located covers at least one second light-emitting device 122b.

In this embodiment, the layer of light-shielding structure is additionally provided in the display panel to implement the arrangement of the light-shielding area, that is, the vertical projection of the first light-shielding structure 141 on the base substrate 11 may form the first light-shielding area 1122, and the vertical projection of the second light-shielding structure 142 on the base substrate 11 may form the second light-shielding area 1124. The vertical projection of the first light-shielding structure 141 on the plane where the base substrate 11 is located covers at least one second light-emitting device 122b, the vertical projection of the second light-shielding structure 142 on the plane where the base substrate 11 is located covers at least one second light-emitting device 122b, and the first light-shielding structure 141 does not have an edge parallel to an edge of the second light-shielding structure 142 so that a light diffraction direction in a first optical component area 112a is different from a light diffraction direction in a second optical component area 112b to enhance the imaging effect in the optical component area of the display panel.

Figure 6:
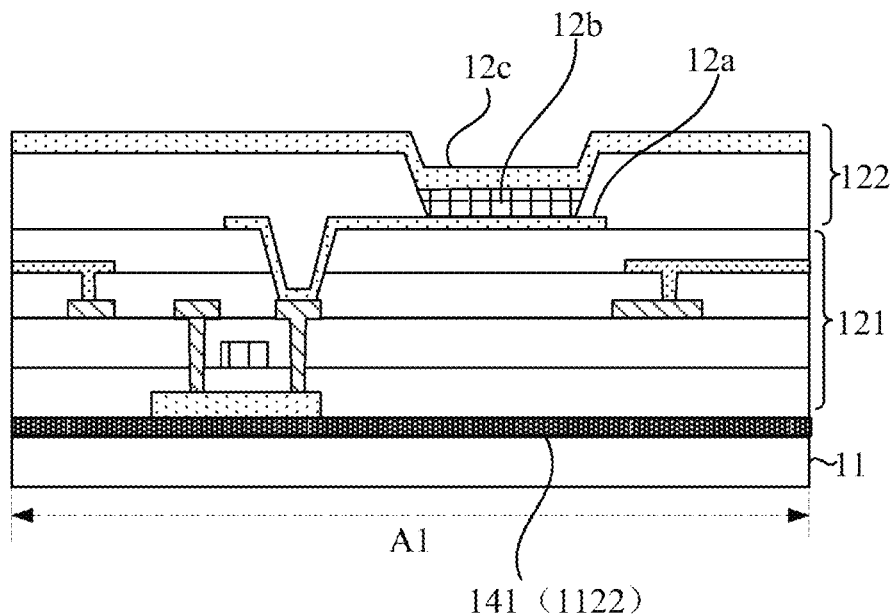
FIG. 6 is a sectional view of a display panel provided by an embodiment of the present disclosure.
Figure 7:
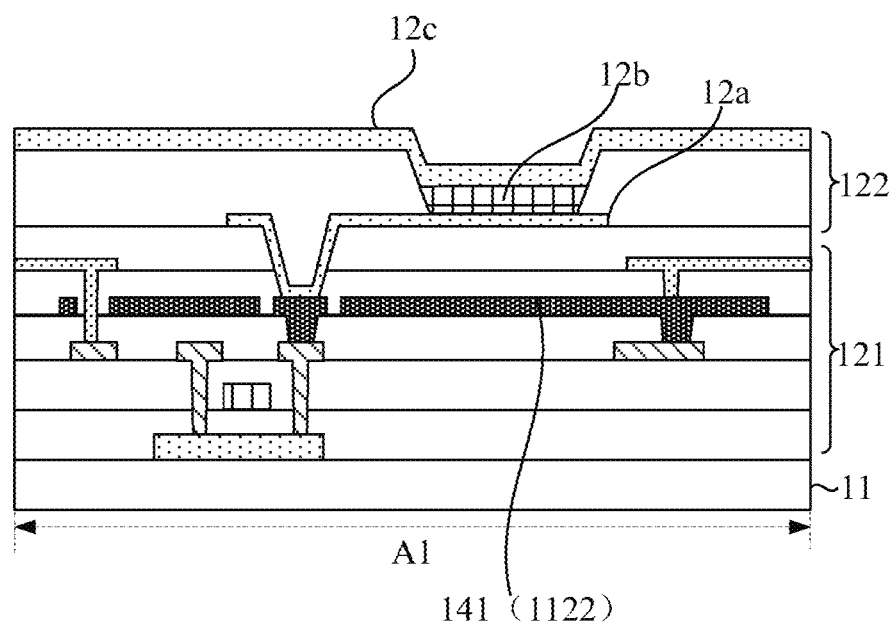
FIG. 7 is a sectional view of another display panel provided by an embodiment of the present disclosure.
Figure 8:
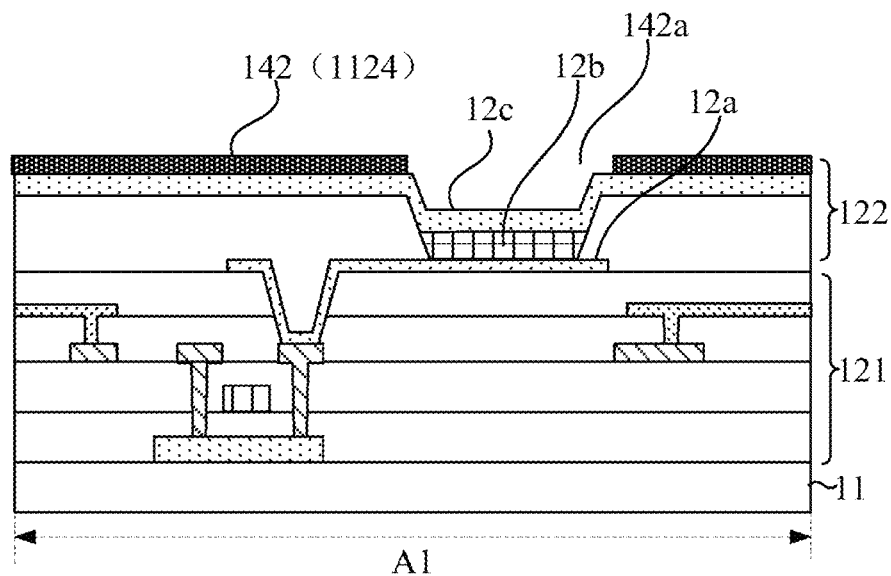
FIG. 8 is a sectional view of another display panel provided by an embodiment of the present disclosure.

FIG. 6 is a sectional view of a display panel provided by an embodiment of the present disclosure, FIG. 7 is a sectional view of another display panel provided by an embodiment of the present disclosure, and FIG. 8 is a sectional view of another display panel provided by an embodiment of the present disclosure. FIGS. 6 to 8 are sectional views taken along a line segment a-a' in FIG. 5. The first light-shielding area 1122 may include a first light-shielding structure 141. The second light-shielding area 1124 includes a second light-shielding structure 142. The first light-shielding structure 141 and the second light-shielding structure 142 are located between the base substrate 11 and the pixel driving circuit 121. Alternatively, the first light-shielding structure 141 and the second light-shielding structure 142 are located between the light-emitting device 122 and the pixel driving circuit 121. Alternatively, the first light-shielding structure 141 and the second light-shielding structure 142 are located on a side of the light-emitting devices 122 facing away from the base substrate 11, and the first light-shielding structure 141 includes a first opening for exposing the corresponding second light-emitting device 122b; and the second light-shielding structure 142 includes a second opening for exposing the corresponding second light-emitting device 122b.

In this embodiment, the pixel driving circuit 121 and the light-emitting device 122 are sequentially disposed on the base substrate 11. Specifically, the light-emitting device 122 includes an anode 12a, a light-emitting layer 12b and a cathode 12c which are sequentially disposed facing away from the base substrate 11. In this embodiment, a layer of light-shielding structure is additionally provided in the display panel to achieve the arrangement of the light-shielding area. This embodiment specifically introduces three different position arrangements of the light-shielding structure. The first position arrangement is that the light-shielding structure may be disposed between the base substrate 11 and the pixel driving circuit 121. As shown in FIG. 6, for example, the first light-shielding area 1122 may include the first light-shielding structure 141. The first light-shielding structure 141 is located on the base substrate 11, and is disposed between the base substrate 11 and the pixel driving circuit 121 to achieve the shielding of a corresponding pixel area A1. It is to be noted that merely a position of the first light-shielding structure 141 is schematically shown in FIG. 6, and the second light-shielding area 1124 may include a second light-shielding structure 142. The second light-shielding structure 142 may also be located between the base substrate 11 and the pixel driving circuit 121. The second position arrangement is that the light-shielding structure may be disposed between the light-emitting device 122 and the pixel driving circuit 121. As shown in FIG. 7, the first light-shielding area 1122 may include a first light-shielding structure 141. The first light-shielding structure 141 is located between the light-emitting device 122 and the pixel driving circuit 121 to achieve the shielding of the corresponding pixel area A1. It is to be noted that the light-emitting device 122 may be electrically connected to the corresponding pixel driving circuit 121 through the light-shielding structure which is made of a metal material. Similarly, merely a position of the first light-shielding structure 141 is schematically shown in FIG. 7. The second light-shielding area 1124 may include the second light-shielding structure 142, and the second light-shielding structure 142 may also be located between the light-emitting device 122 and the pixel driving circuit 121. The third position arrangement is that the light-shielding structure is located on a side of the light-emitting device 122 facing away from the base substrate 11. For example, as shown in FIG. 8, the second light-shielding area 1124 may include a second light-shielding structure 142, the second light-shielding structure 142 includes a second opening 142a which is able to expose the second light-emitting device 122b, so that the normal display of the optical component area is achieved while at least one pixel area A1 is shielded. Similarly, merely a position of the second light-shielding structure 142 is schematically shown in FIG. 8. The first light-shielding area 1122 may include the first light-shielding structure 141. The first light-shielding structure 141 may also be located on the side of the light-emitting device 122 facing away from the base substrate 11. It is to be noted that the above arrangements of the light-shielding structure are just a few examples listed in the embodiment of the present disclosure, and the light-shielding structure may also be disposed in other positions, which is not limited in this embodiment. In this embodiment, the layer of light-shielding structure is additionally provided to implement the setting of the light-shielding area. It is to be noted that the first light-shielding structure 141 do not include an edge parallel to an edge of the second light-shielding structure 142 so as to improve the imaging quality of the optical component area of the display panel.

Referring to FIG. 4, in the case where the anodes 12a are multiplexed as the light-shielding structures to form the light-shielding areas, the anode 12a of the second light-emitting device 122b in the first optical component area 112a and the anode 12a of the second light-emitting device 122b in the second optical component area 112b may have the same size. The anode 12a of the second light-emitting device 122b in the first optical component area 112a includes a first edge L1, and the anode 12a of the second light-emitting device 122b in the second optical component area 112b includes a second edge L2 having the same size as the first edge L1. A first included angle θ is provided between an extension direction of the first edge L1 and an extension direction of the second edge L2.

In the case where the anode 12a is multiplexed as the light-shielding structure, to ensure that the anode 12a of the second light-emitting device 122b in the first optical component area 112a does not have an edge parallel to an edge of the anode 12a of the second light-emitting device 122b in the second optical component area 112b, the anode 12a in the first optical component area 112a and the anode 12a in the second optical component area 112b are identical in shape and size. It is to be noted that when two plane figures are compared, the size in this embodiment includes the shape and magnitude, and when lengths of two edge lines are compared, the size in this embodiment only includes the length. In this embodiment, in the case where the anode 12a in the first optical component area 112a and the anode 12a in the second optical component area 112b have the same size, to ensure that the anode 12a in the first optical component area 112a does not have an edge parallel to an edge of the anode 12a in the second optical component area 112b, the anode 12a in the second optical component area 112b needs to have a certain rotation angle with respect to the anode 12a in the first optical component area 112a, that is, the first included angel θ is provided between corresponding edges having the same size of the anode 12a in the first optical component area 112a and the anode 12a in the second optical component area 112b. Exemplarily, if the anodes 12a are rectangular, each anode 12a includes edges LA, LB, LC and LD which are sequentially connected, and the edge LA of the anode 12a in the first optical component area 112a and the edge LA of the anode 12a of the second optical component are 112b are the corresponding edges having the same size. In this embodiment, the anode 12a of the second light-emitting device 122b in the first optical component area 112a includes the first edge L1, the anode 12a of the second light-emitting device 122b in the second optical component area 112b includes the second edge L2 corresponding to the first edge L1 and having the same size as the first edge L1. The first included angel θ is provided between the extension direction of the first edge L1 and the extension direction of the second edge L2 to achieve that the anode 12a in the first optical component area 112a does not have an edge parallel to an edge of the anode 12a in the second optical component area 112b, so that a light diffraction direction in the first optical component area 112a is different from a light diffraction direction in the second optical component area 112b, which facilitates obtaining a complete captured image subsequently according to the imaging in the first optical component area 112a and the second optical component area 112b, thereby improving the shooting clarity.

The first included angle θ may range from 15° to 90°. In this embodiment, providing the first included angle θ between the corresponding edges of the anode 12a in the first optical component area 112a and the anode 12a in the second optical component area 112b is equivalent to rotating the anode 12a in the first optical component area 112a clockwise or counterclockwise to obtain an arrangement angle of the anode 12a in the second optical component area 112b. In this embodiment, a value of the first included angle θ may be greater than or equal to 15°, so that the diffraction directions of the first optical component area 112a and the second optical component area 112b are clearly distinguished, avoiding a situation where the light diffraction directions overlap or cannot be distinguished, thereby facilitating obtaining a final high-definition image according to the images in different diffraction directions, and improving the display quality of the panel. Referring to FIG. 4, the anodes 12a are rectangular, and the first included angle may range from 30° to 70°. In the range of 30° to 70°, the light diffraction directions in the first optical component area 112a and the second optical component area 112b are clearly distinguished, which is favorable to extract imaging information, and the anode 12a in the first optical component area 112a and the anode 12a in the second optical component area 112b are not easy to have the edges parallel to each other, further enhancing the imaging quality of the optical component area. On the basis of the above embodiments, the first included angle may be 45°, which further improves the imaging quality of the optical component area, and significantly improves the imaging loss caused by light diffraction.

Figure 9:
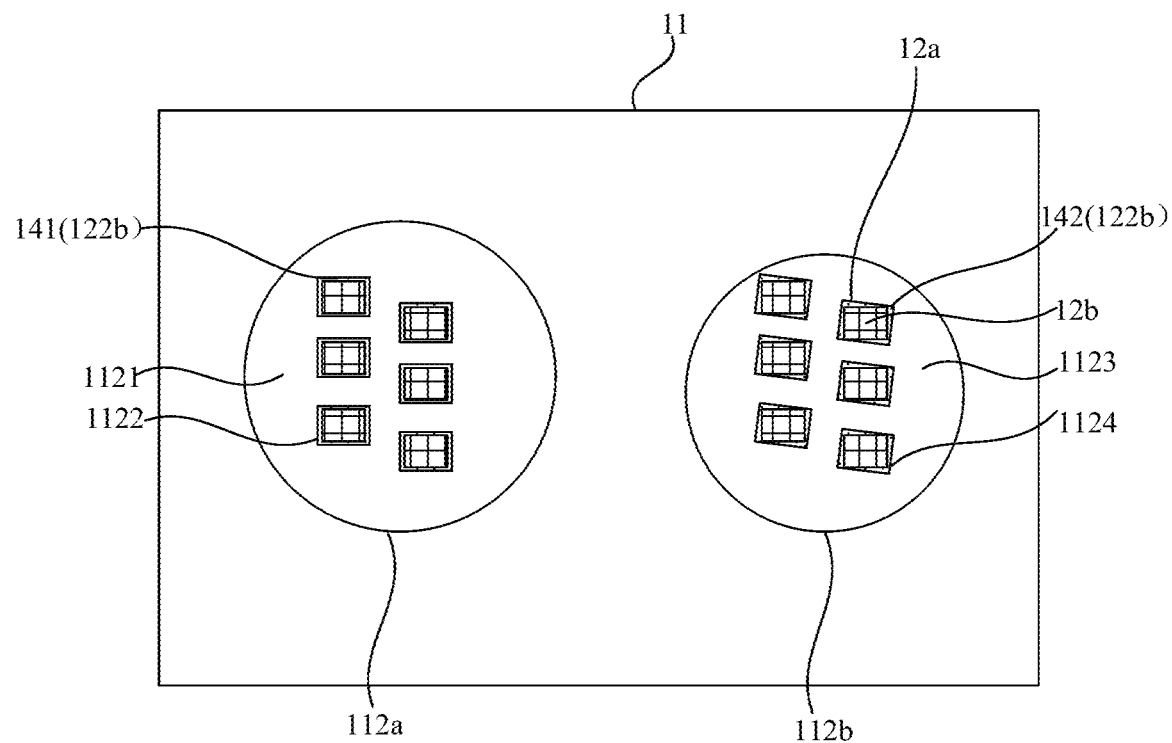
FIG. 9 is a structure diagram of another display panel provided by an embodiment of the present disclosure.

FIG. 9 is a structure diagram of another display panel provided by an embodiment of the present disclosure. A vertical projection of a light-emitting layer 12b of a light-emitting device on the plane where the base substrate 11 is located may be located within an anode 12a of the light-emitting device. The light-emitting layer 12b of the second light-emitting device 122b in the first optical component area 112a and the light-emitting layer 12b of the second light-emitting device 122b in the second optical component area 112b may have the same size.

The anode 12a in the first optical component area 112a and the anode 12a in the second optical component area 112b have the same size, and the light-emitting layer 12b on the anode 12a in the first optical component area 112a and the light-emitting layer 12b on the anode 12a in the second optical component area 112b may also have the same size. In addition, in the plane perpendicular to the base substrate 11, the vertical projection of the light-emitting layer 12b is located within the anode 12a of the corresponding light-emitting device, thereby avoiding that a contact area between the light-emitting layer 12b and the anode 12a is too small to affect the light-emitting efficiency. In this embodiment, the light-emitting layers 12b of the second light-emitting devices 122b in the two optical component areas has the same size, which can effectively ensure the uniformity of the two optical component areas in brightness, and enhance the display effect of the display panel. In addition, in this embodiment, an area of the light-emitting layer 12b in the first optical component area 112a may be provided to be the same as an area of the light-emitting layer 12b in the second optical component area 112b, and the vertical projection of the light-emitting layer 12b on the base substrate 11 is located within the corresponding anode 12a, which can ensure the uniformity of the two optical component areas in brightness without limiting the second optical component areas 112b in the two optical component areas to have the same shape.

Figure 10:
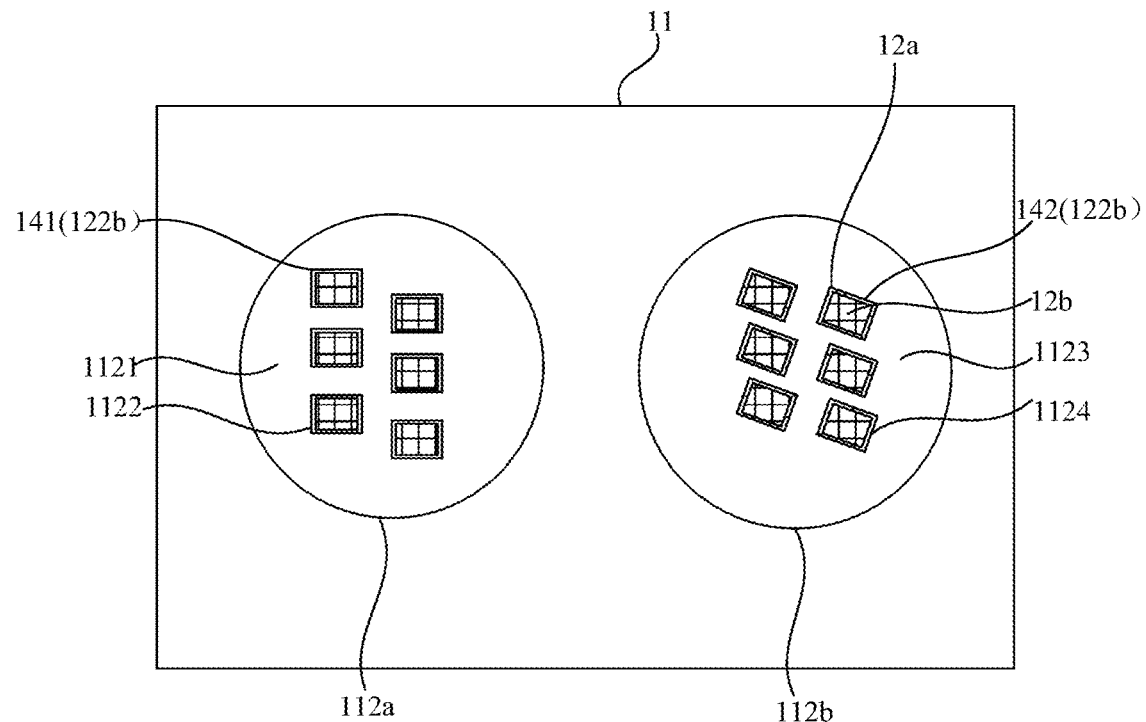
FIG. 10 is a structure diagram of another display panel provided by an embodiment of the present disclosure.

FIG. 10 is a structure diagram of another display panel provided by an embodiment of the present disclosure. In a case where a shape of an anode 12a in the first optical component area 112a is same as a shape of an anode 12a in the second optical component area 112b, a size of the light-emitting layer 12b on the anode 12a in the first optical component area 112a may be the same as a size of the light-emitting layer 12b on the anode 12a in the second optical component area 112b, the light-emitting layer 12b in the first optical component area 112a includes a third edge, and the light-emitting layer 12b in the second optical component area 112b includes a fourth edge which has the same size as the third edge. A first included angle θ is provided between an extension direction of the third edge and an extension direction of the fourth edge, which is equivalent to rotating the anode 12a in the first optical component area 112a clockwise or counterclockwise to obtain an arrangement angle of the anode 12a in the second optical component area 112b, and rotating the light-emitting layer 12b in the first optical component area 112a clockwise or counterclockwise to obtain an arrangement angle of the light-emitting layer 12b of the second optical component area 112b, so that the solution in this embodiment can effectively ensure the brightness of the two optical component areas to be consistent and enhance the display effect of the display panel.

Figure 11:
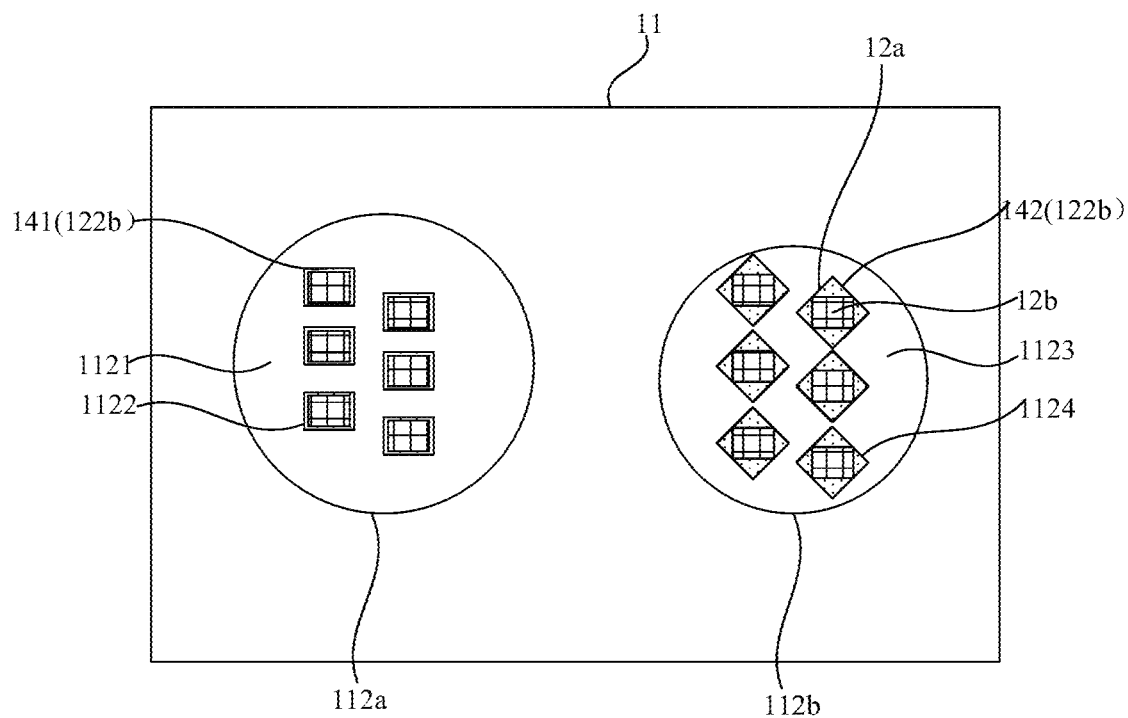
FIG. 11 is a structure diagram of another display panel provided by an embodiment of the present disclosure.

FIG. 11 is a structure diagram of another display panel provided by an embodiment of the present disclosure. A shape of the anode 12a of the second light-emitting device 122b in the first optical component area 112a may be different from a shape of the anode 12a of the second light-emitting device 122b in the second optical component area 112b.

As shown in FIG. 11, in this embodiment, the anodes 12a in the two optical component areas may be configured to have different shapes, so that the anodes 12a in the two optical component areas do not have edges parallel to each other. Exemplarily, as shown in FIG. 11, the shape of the anode 12a of the second light-emitting device 122b in the first optical component area 112a is rectangular, the shape of the anode 12a of the second light-emitting device 122b in the second optical component area 112b is diamond-shaped, and different shapes of the anodes 12a cause the light diffraction direction in the first optical component area 112a and the light diffraction direction in the second optical component area 112b to be different, thereby improving the imaging quality of the optical component area and significantly improving the imaging loss caused by light diffraction. In addition, the shapes of the anodes 12a may be other combinations, for example, the shape of the anode 12a of the second light-emitting device 122b in the first optical component area 112a may be a parallelogram, and the shape of the anode 12a of the second light-emitting device 122b in the second optical component area 112b may be a regular triangle, and the shape combination arrangement of the anodes 12a of the two optical component areas is not particularly limited in this embodiment.

Similarly, when the shapes of the anodes 12a in the two optical component areas are different, a vertical projection of a light-emitting layer 12b of a light-emitting device in the plane where the base substrate 11 is located may be located within an anode 12a of the light-emitting device. The light-emitting layer 12b of the second light-emitting device 122b in the first optical component area 112a and the light-emitting layer 12b of the second light-emitting device 122b in the second optical component area 112b have the same size. Therefore, the uniformity of the two optical component areas in brightness can be ensured, and the display effect of the display panel can be enhanced.

Figure 12:
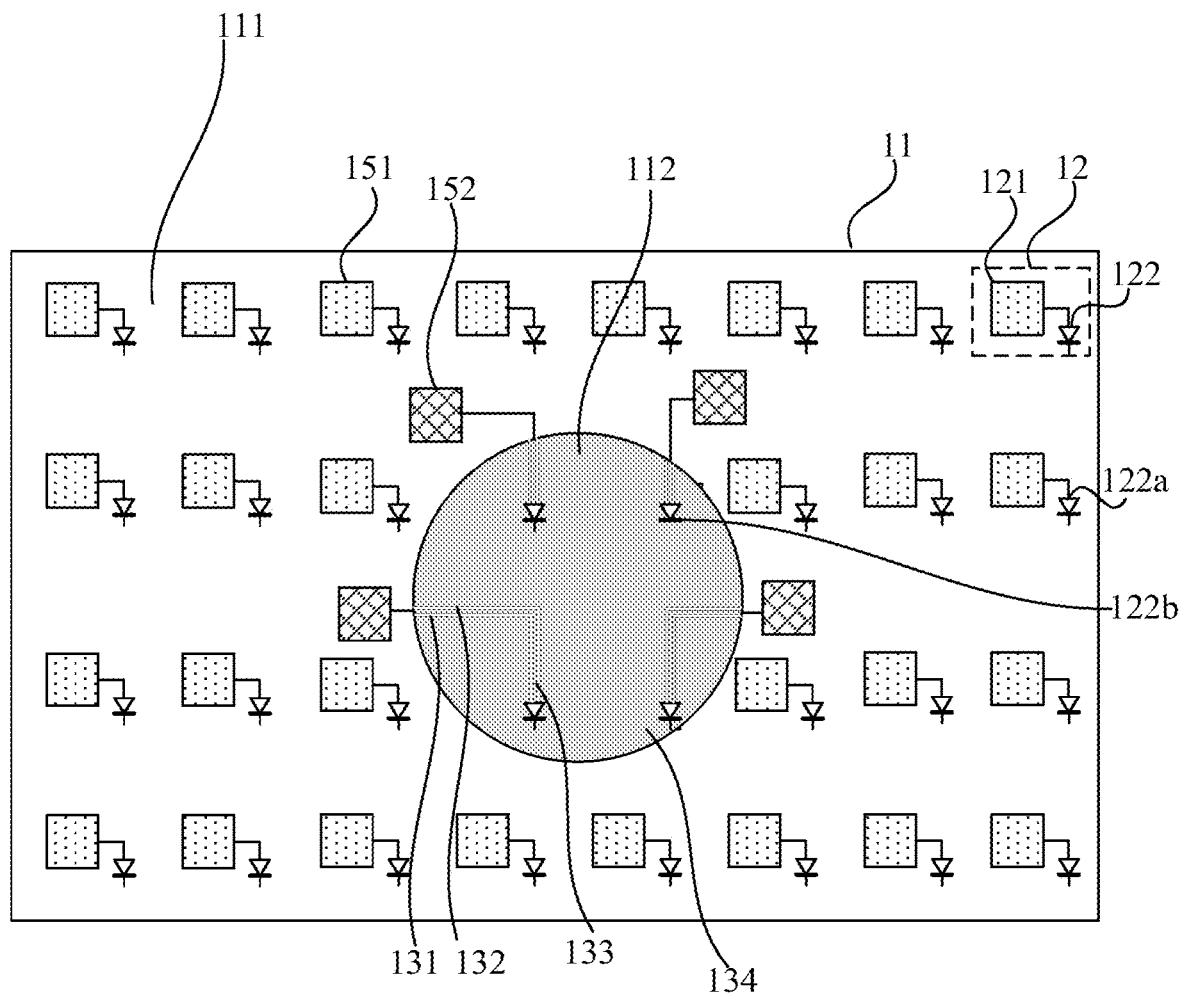
FIG. 12 is a structure diagram of another display panel provided by an embodiment of the present disclosure.

FIG. 12 is a structure diagram of another display panel provided by an embodiment of the present disclosure. The display panel may further include at least one transparent conductive layer 13; and the at least one transparent conductive layer 13 is disposed in an optical component area. The at least one transparent conductive layer 13 includes: a first slit 131 and a second slit 132 which are disposed in pairs; a connection wire 133 formed between the first slit 131 and the second slit 132 which are disposed in pairs; and an auxiliary layer 134 located outside the first slit 131 and the second slit 132 which are disposed in pairs. The pixel driving circuits include first pixel driving circuits 151 and second pixel driving circuits 152. The first pixel driving circuits 151 are located in the conventional display area 111 and is each electrically connected to a corresponding first light-emitting device 122a. The second pixel driving circuits 152 are located in the conventional display area 111 and is each electrically connected to a corresponding second light-emitting device 122b by the connection wire.

In this embodiment, the anode is multiplexed as the light-shielding structure. The display area includes the conventional display area 111 and the optical component area 112. The light-emitting devices 122 includes the first light-emitting devices 122a and the second light-emitting devices 122b, and the conventional display area 111 is provided with the first light-emitting devices 122a arranged in an array, and the optical component area 112 is provided with the second light-emitting devices 122b arranged in an array. It is to be noted that, in this embodiment, the pixel driving circuits include the first pixel driving circuits 151 and the second pixel driving circuits 152. The first pixel driving circuit 151 is electrically connected to the corresponding first light-emitting device 122a and is used for driving the first light-emitting device 122a. The second pixel driving circuit 152 is electrically connected to the corresponding second light-emitting device 122b and is used for driving the second light-emitting device 122b. It is to be noted that in this embodiment, the first pixel driving circuit 151 and the second pixel driving circuit 152 are disposed in the conventional display area 111, merely the second light-emitting devices 122b are disposed in the optical component area 112, which is favorable to further improve the light transmittance of the optical component area 112. Specifically, the optical component area is provided with a monolithic transparent conductive layer 13. The transparent conductive layer 13 includes the first slit 131 and the second slit 132 which are disposed in pairs, and the connection wire 133 is formed between the first slit 131 and the second slit 132 which are disposed in pairs. The connection wire 133 may connect the second pixel driving circuit 152 with the corresponding second light-emitting device 122b. An area outside the first slits 131, the second slits 132, and the connection wires 133 is called as the auxiliary layer 134. In this embodiment, each connection wire 133 is formed by a transparent material, and does not form the light-shielding structure. In this embodiment, the second light-emitting devices 122b are designed merely in the photosensitive element area, the second pixel driving circuits 152 are disposed outside the photosensitive element area, and the connection wires 133 have a light transmittance effect and do not cause strong diffraction, so that the diffraction direction in the optical component area is adjusted merely by the anodes, which is favorable to arrange and adjust the diffraction directions in the optical component areas, thereby improving the display effect of the finally formed image.

On the basis of the above embodiments, the transparent conductive layer may further include a cathode connecting line. The cathode of the at least one second light-emitting device is electrically connected to a cathode signal line by the corresponding cathode connecting line. In this embodiment, the cathode connecting line which does not shield the light is formed by the slits which are disposed in pairs, which ensures that the cathode of the second light-emitting device is electrically connected to the cathode signal line and the cathode connecting line does not lead to a strong diffraction phenomenon. The diffraction direction in the optical component area is adjusted merely by the anode, which is favorable to arrange and adjust the diffraction directions in the optical component areas.

Figure 13:
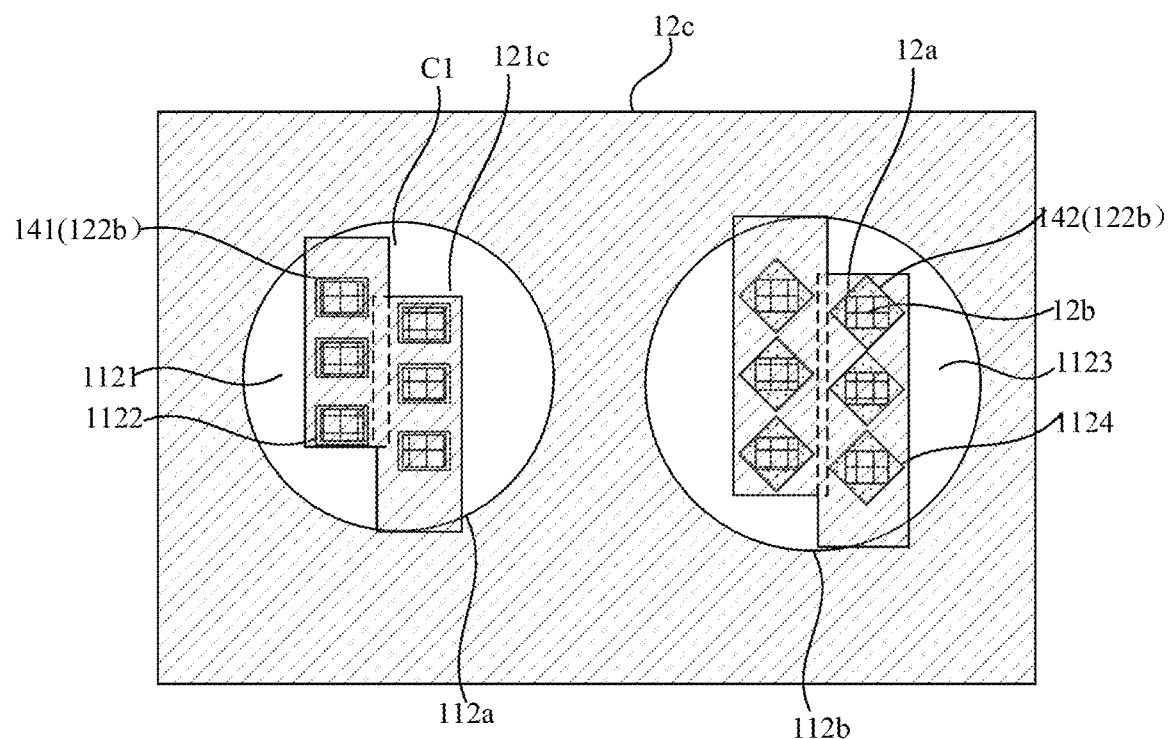
FIG. 13 is a structure diagram of another display panel provided by an embodiment of the present disclosure.
Figure 14:
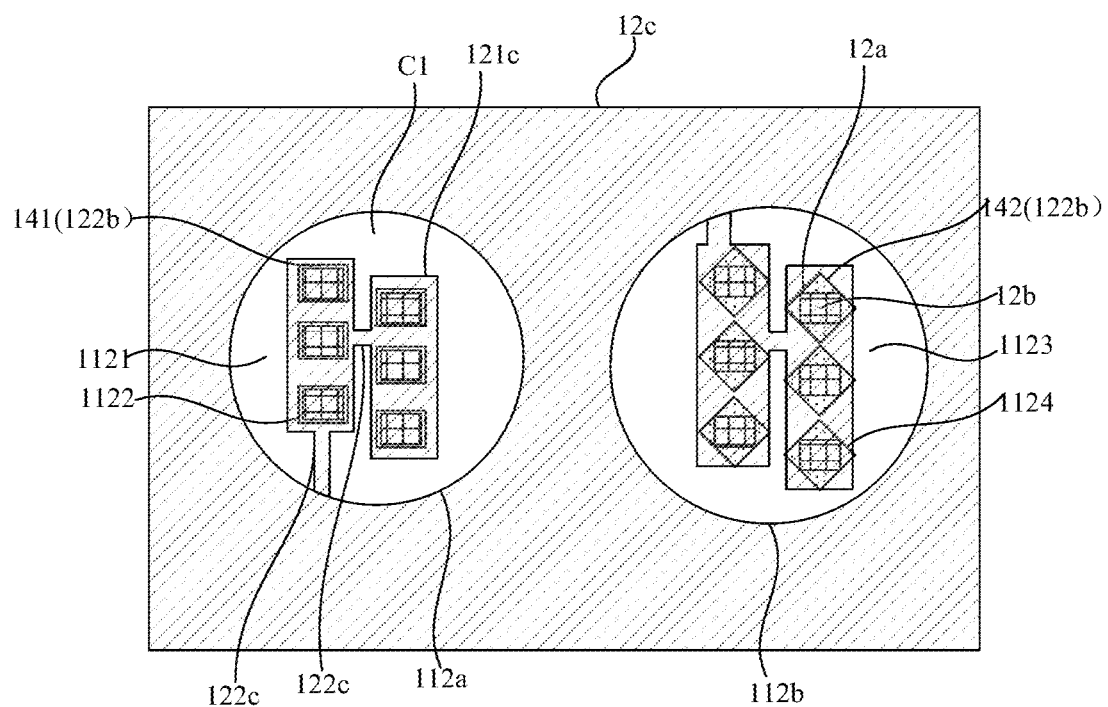
FIG. 14 is a structure diagram of another display panel provided by an embodiment of the present disclosure.

FIG. 13 is a structure diagram of another display panel provided by an embodiment of the present disclosure. FIG. 14 is a structure diagram of another display panel provided by an embodiment of the present disclosure. A cathode 12c in the optical component area may include a hollow area C1. A vertical projection of the hollow area C1 on the plane where the base substrate 11 is located is located within the first light-transmitting area 1121 and the second light-transmitting area 1123. In this embodiment, the cathode 12c is patterned. Specifically, a hollow area C1 is formed on the cathode 12c. An orthographic projection of the hollow area C1 on the base substrate 11 is located in the first light-transmitting area 1121 or the second light-transmitting area 1123, or a vertical projection of the hollow area C1 on the plane where the base substrate 11 is located is located within the first light-transmitting area 1121 and the second light-transmitting area 1123, thereby further increasing the light transmittance of the optical component area and improving the optical imaging effect. In this embodiment, the hollow area C1 whose vertical projection is located in the first light-transmitting area 1121 and the hollow area C1 whose vertical projection is located in the second light-transmitting area 1123 are configured to have the same area, so that the shooting brightness in the two optical component areas is the same, thereby improving the shooting effect.

Referring to FIGS. 13 and 14, the optical component area may include multiple first cathode blocks 121c. Each first cathode block 121c serves as the cathode of at least one light-emitting device; the first cathode block 121c is disposed corresponding to the first light-shielding area 1122; a vertical projection of the first cathode block 121c on the plane where the base substrate 11 is located covers the corresponding first light-shielding area 1122 or second light-shielding area 1124. The vertical projections of adjacent first cathode blocks 121c on the plane where the base substrate 11 is located have an overlapping part; or adjacent first cathode blocks 121c are connected by a cathode bridge line 122c, and a vertical projection of the cathode bridge line 122c on the plane where the base substrate 11 is located is located in a gap area between the adjacent first cathode blocks 121c.

In this embodiment, the cathode 12c with the hollow area includes multiple first cathode blocks 121c in the optical component area. An orthographic projection of each first cathode block 121c on the substrate 11 covers at least one first light-shielding area 1122 or at least one second light-shielding area 1124, and the first cathode block 121c serves as the cathode of the light-emitting device in the light-shielding area covered by the orthographic projection of the first cathode block 121c. As shown in FIG. 13, adjacent first cathode blocks 121c may partially overlap to achieve the electric connection between the first cathode blocks 121c, or as shown in FIG. 14, adjacent first cathode blocks are connected by the cathode bridge line 122c so that the cathodes in the optical component area have a unified potential, ensuring the uniformity of the display brightness in the two optical component areas. A total area of the first cathode blocks 121c in the first optical component area 112a may be the same as a total area of the first cathode blocks 121c of the second optical component area 112b to achieve the uniformity of the imaging brightness in the two component areas. In addition, the first cathode block 121c and the cathode 12c of the conventional display area 111 may partially overlap or be connected by the cathode bridge line 122c to unify potentials of the cathodes in the conventional display area 111 and the optical component area 112, thereby ensuring the uniformity of the display brightness of the entire display panel.

A density of second light-emitting devices 122b in the optical component area may be less than or equal to a density of first light-emitting devices 122a in the conventional display area. The density of light-emitting devices in the optical component area is configured to be small, which is favorable to improve the imaging clarity and shooting effect in the optical component area.

The display area may further include a transition display area located between the conventional display area and the optical component area. The light-emitting devices further include third light-emitting devices. A density of the third light-emitting devices in the transition display area is greater than a density of the second light-emitting device in the optical component area, and less than a density of the first light-emitting devices in the conventional display area. On the basis that the density of the second light-emitting devices in the optical component area is less than the density of first light-emitting devices in the conventional display area, in this embodiment, the transition display area is further provided between the conventional display area and the optical component area, the third light-emitting devices are disposed in the transition display area, and the density of the second light-emitting devices, the density of the third light-emitting devices and the density of the first light-emitting devices increase sequentially, so that the display brightness of display panel gradually decreases in a gradient manner from the conventional display area to the transition display area to the optical component area. Such arrangement of the transition display area can avoid a split screen phenomenon due to abrupt brightness transition from the conventional display area to the optical component area, improving the panel display effect of the display panel and the user viewing comfort.

Figure 15:
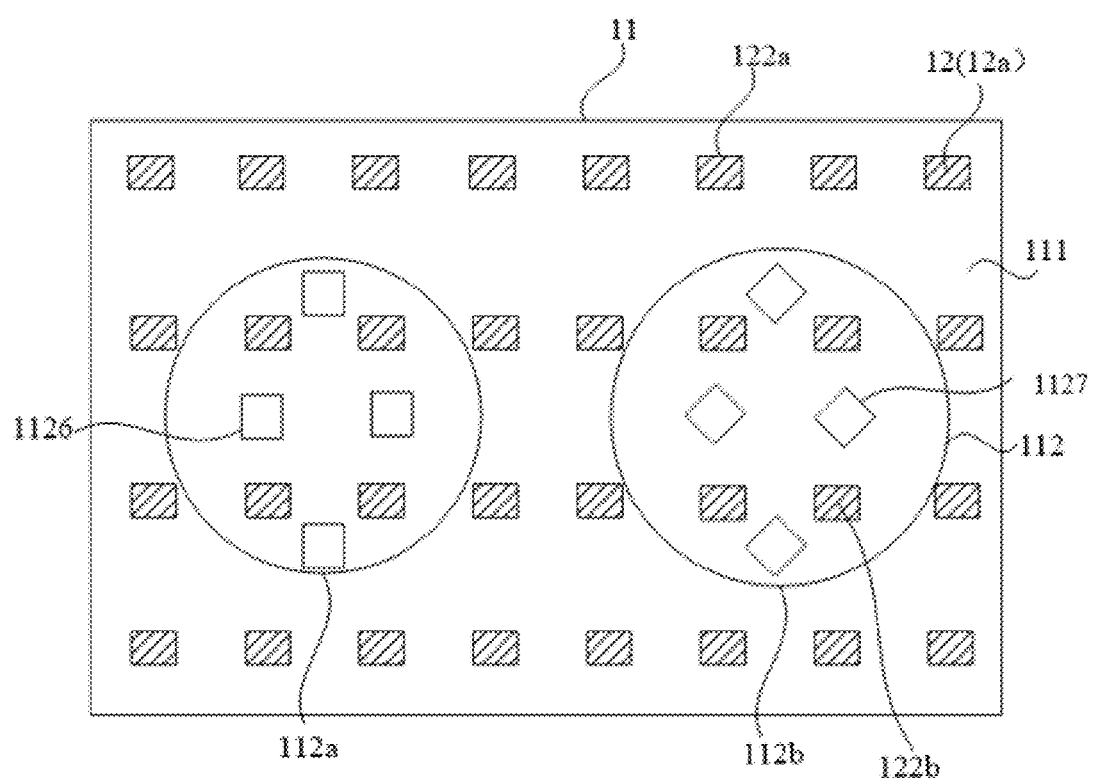
FIG. 15 is a structure diagram of another display panel provided by an embodiment of the present disclosure.

An embodiment of the present disclosure also provides a display panel. As shown in FIG. 15, FIG. 15 is a structure diagram of another display panel provided by an embodiment of the present disclosure. The display panel includes a display area and a base substrate 11. The display area includes an optical component area 112 and a conventional display area 111.

The base substrate 11 includes multiple pixels 12, and each pixel includes a light-emitting device and a pixel driving circuit which is electrically connected to the light-emitting device. The light-emitting device is provided with an anode 12a, a light-emitting layer and a cathode disposed sequentially in a direction away from the base substrate 11.

The light-emitting devices include first light-emitting devices 122a and second light-emitting devices 122b. The conventional display area 111 is provided with the first-light emitting devices 122a arranged in an array. The optical component area 112 is provided with the second light-emitting devices 122b arranged in an array.

The optical component area 112 includes a first optical component area 112a and a second optical component area 112b. The first optical component area 112a includes multiple first light-transmitting areas 1126. A vertical projection of each first light-transmitting area 1126 on a plane where the base substrate 11 is located is located in a gap between two adjacent pixels 12. The second optical component area 112b includes multiple second light-transmitting areas 1127. A vertical projection of each second light-transmitting area 1127 on the plane where the base substrate 11 is located is located in a gap between two adjacent pixels 12.

The vertical projection of the first light-transmitting area 1126 on the plane where the base substrate 11 is located does not have an edge parallel to an edge of the vertical projection of the second light-transmitting area 1127 on the plane where the base substrate 11 is located.

In this embodiment, the first optical component area 112a includes multiple first light-transmitting areas 1126, and the rest of the first optical component area 112a is an opaque area. The second optical component area 112b includes multiple second light-transmitting areas 1127, and the rest of the second optical component area 112b is an opaque area. Each light-transmitting area is located in a gap between adjacent pixels, so that external light is imaged through the light-transmitting areas. Light diffraction in a certain direction is easy to occur at the edge of the light-transmitting area. In this embodiment, the vertical projection of the first light-transmitting area 1126 on the plane where the base substrate 11 is located does not have an edge parallel to an edge of the vertical projection of the second light-transmitting area 1127 on the plane where the base substrate 11 is located, so that a light diffraction direction in the first optical component area 112a is different from a light diffraction direction in the second optical component area 112b.

In this embodiment, the vertical projection of the light-transmitting area on the plane where the base substrate 11 is located does not overlap with the pixel driving circuit. The light-transmitting area is a through hole formed along a stacking direction of the display panel, and exemplarily, the through hole may be filled with a transparent material.

In the embodiments of the present disclosure, the display panel includes the base substrate and multiple pixels disposed on the base substrate. Each pixel includes the light-emitting device and the pixel driving circuit which is electrically connected to the light-emitting device. The light-emitting devices includes the first light-emitting devices and the second light-emitting devices. The first light-emitting devices are disposed in the conventional display area and the second light-emitting devices are disposed in the optical component area. The optical component area includes the first optical component area and the second optical component area. The first optical component area includes multiple first light-transmitting areas. Similarly, the second optical component area includes multiple second light-transmitting areas. The first light-transmitting area and the second light-transmitting area are disposed in the gap between adjacent pixels, and the first light-transmitting area does not have an edge parallel to an edge of the second light-transmitting area. A light diffraction phenomenon occurs between the light-shielding area and the light-transmitting area and causes the imaging loss of the optical component. The first light-transmitting area does not have an edge parallel to an edge of the second light-transmitting area in the embodiment of the present disclosure, and a light diffraction direction in the first optical component area is different from a light diffraction direction in the second optical component area. Images with different imaging missing information are obtained in the first optical component area and the second optical component area respectively through different optical components, thus complete imaging information is obtained according to the different optical components, and the imaging quality of the optical component area is finally improved.

Figure 16:
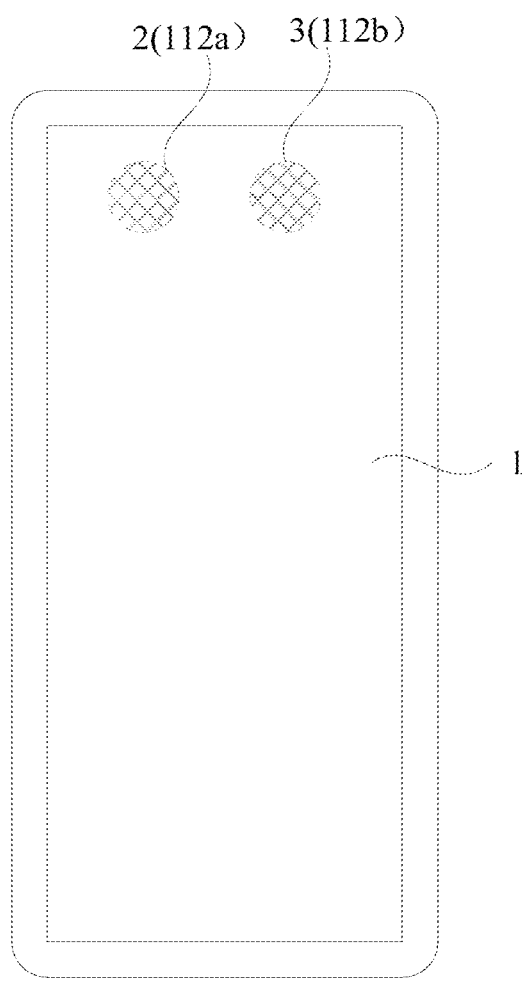
FIG. 16 is a structure diagram of a display device provided by an embodiment of the present disclosure.

An embodiment of the present disclosure further provides a display device. This display device includes the display panel 1 described in any one of embodiments of the present disclosure. FIG. 16 is a structure diagram of a display device provided by an embodiment of the present disclosure. As shown in FIG. 16, the display device may be a mobile phone shown in FIG. 16, or a display device including an optical component, such as a computer, a television, a smart wearable device, etc., and the optical component may be a camera, a viewfinder, etc., which is not specifically limited in the embodiment. Specifically, referring to FIG. 16, the display device may further include: a first camera 1, a second camera 2 and a signal processing chip The first camera 2 is disposed on a side of a base substrate facing away from multiple pixels. A vertical projection of the first camera 2 on the base substrate is located within a first optical component area 112a, and the first camera 2 is configured to capture first image information. The first image information has a diffraction direction in a first direction, and loses a first part of image information in the first direction.

The second camera 3 is disposed on the side of the base substrate facing away from the multiple pixels. A vertical projection of the second camera 3 on the base substrate is located within the second optical component area 112b, and the second camera 3 is configured to capture second image information. A diffraction direction of the second image information intersects with the first direction.

The signal processing chip (not shown in FIG. 16) is configured to extract a first part of image information of the second image information in the first direction, and superimpose the first part of image information on the first image information to form complete image information.

Figure 17:
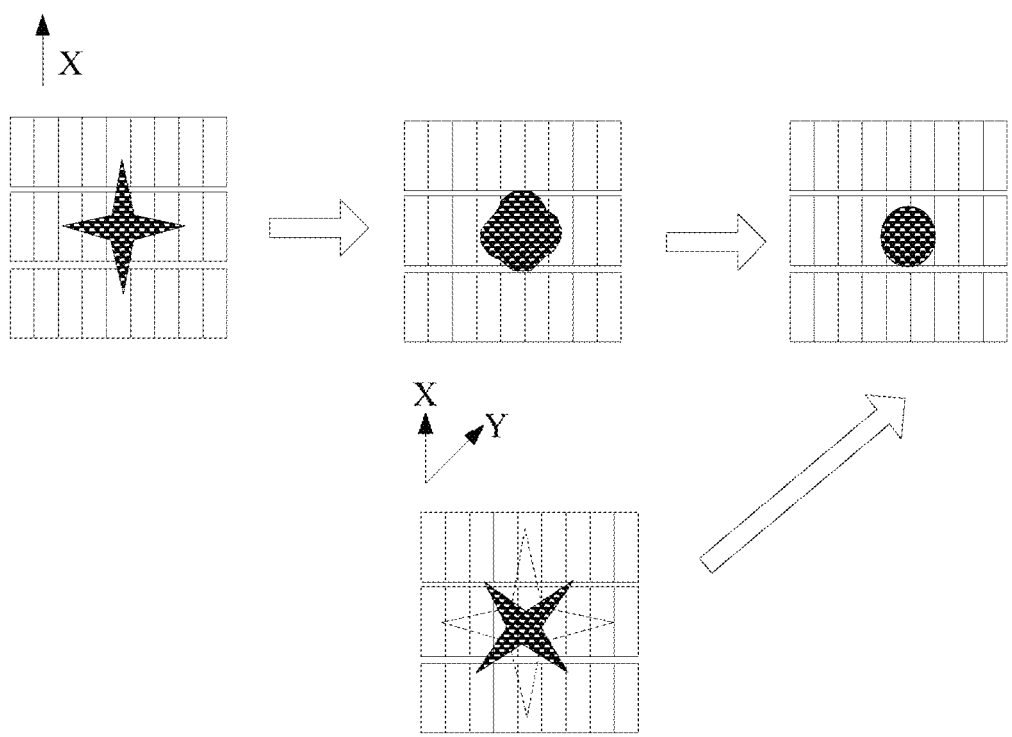
FIG. 17 is a flowchart of image extraction provided by an embodiment of the present disclosure.

During a camera imaging process, an optical image of a scene generated by a lens of the camera is projected onto a surface of an image sensor, and then is converted into an electrical signal by a photodiode, then the electrical signal is changed into a digital image signal through analog-to-digital conversion, and the digital image signal is processed by the signal processing chip, such as a digital signal processing chip. Specifically, FIG. 17 is a flowchart of image extraction provided by an embodiment of the present disclosure. The image taken by the camera is missing information in the diffraction direction, as shown in FIG. 17, the diffraction directions of the first optical component area 112a and the second optical component area 112b are different, so that lost parts of the captured image information are different. The first image information loses the first part of image information in the first direction X, the first image information still has a problem of losing the first part of the image information in the first direction X after algorithm optimization. The second image information loses a second part of image information in a second direction Y, but does not lose the first part of image information in a dotted line direction. In this embodiment, the first part of image information is extracted from the second image information in the first direction, and the first image information is fitted with the first part of image information extracted from the second image information, and complete image information is acquired after algorithm processing. The complete image information has a clear picture. The differential arrangement of the light-shielding area or the light-transmitting area of a bi-optical-component area (excluding parallel edges) in this embodiment enables superposition to eliminate diffraction through the later algorithm processing, thereby obtaining a complete image and improving the shooting performance of the display device.

The display device provided by the embodiments of the present disclosure includes all the technical features of the display panel provided by any embodiment of the present disclosure, and has the beneficial effects of the corresponding features, which will not be repeated in this embodiment description. In addition, the display device also captures the first image information in the first optical component area by the first camera, and captures the second image information in the second optical component area by the second camera. Due to the diffraction problem of the first optical component area in the first direction, the first image information may lose the first part of image information in the first direction, and similarly, due to the diffraction problem of the second optical component area in the second direction, the second image information may lose the second part of image information in the second direction but includes the first part of image information in the first direction. The signal processing chip of the display device can effectively extract the first part of image information in the second image information in the first direction, and the first part of image information in the second image information in the first direction is superimposed with the first image information captured by the first camera to form the complete image information. This embodiment provides an integration mode for integrating the first image information and the second image information, which is favorable to enhance the imaging effect of the optical component area of the display panel and improve the shooting experience of the user.

On the basis of the above embodiments, the display device may further include an IO interface (not shown in FIG. 16). The IO interface is electrically connected to the signal processing chip and is used for transmitting the complete image information to a main controller of the display panel. The complete image information processed by the signal processing chip may be transmitted to a screen of a computer or a mobile phone through the IO interface to display.

It is to be noted that the preceding are only example embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising:
a display area comprising an optical component area and a conventional display area; and
a base substrate comprising a plurality of pixels, wherein each pixel of the plurality of pixels comprises a light-emitting device and a pixel driving circuit which is electrically connected to the light-emitting device, and wherein the light-emitting device comprises an anode, a light-emitting layer, and a cathode disposed sequentially in a direction away from the base substrate;
wherein light-emitting devices of the plurality of pixels comprise first light-emitting devices and second light-emitting devices; wherein the conventional display area comprises the first light-emitting devices arranged in a first array; wherein the optical component area comprises the second light-emitting devices arranged in a second array;
wherein the optical component area comprises a first optical component area and a second optical component area; wherein the first optical component area comprises a first light-transmitting area and a plurality of first light-shielding areas; wherein a first vertical projection of each of the plurality of first light-shielding areas on a plane where the base substrate is located covers at least one of the second light-emitting devices in the first optical component area; wherein the second optical component area comprises a second light-transmitting area and a plurality of second light-shielding areas; wherein a second vertical projection of each of the plurality of second light-shielding areas on the plane where the base substrate is located covers at least one of the second light-emitting devices in the second optical component area; and
wherein the plurality of first light-shielding areas in the first optical component area do not have an edge parallel to an edge of the plurality of second light-shielding areas in the second optical component area.

2. The display panel of claim 1, wherein each of the plurality of first light-shielding areas comprises a first light-shielding structure; an anode of a respective one of the second light-emitting devices in the first optical component area is multiplexed as the first light-shielding structure; a vertical projection of the first light-shielding structure on the plane where the base substrate is located covers the respective one of the second light-emitting devices in the first optical component area; each of the plurality of second light-shielding area comprises a second light-shielding structure; an anode of a respective one of the second light-emitting devices in the second optical component area is multiplexed as the second light-shielding structure of the second light-shielding structure on the plane where the base substrate is located covers the respective one of the second light-emitting devices in the second optical component area; and
the anode of the respective one of the second light-emitting devices in the first optical component area does not have an edge parallel to an edge of the anode of the respective one of the second light-emitting devices in the second optical component area.

3. The display panel of claim 1, wherein first shapes of the plurality of first light-shielding areas comprise at least one of a regular triangle, a rectangle, a parallelogram, a regular pentagon, a regular hexagon or a trapezoid, and second shapes of the plurality of second light-shielding areas comprise light-shielding at least one of a regular triangle, a rectangle, a parallelogram, a regular pentagon, a regular hexagon or a trapezoid.

4. The display panel of claim 1, wherein each of the plurality first light-shielding areas comprises a first light-shielding structure; each of the plurality second light-shielding areas comprises a second light-shielding structure; and
a vertical projection of the first light-shielding structure on the plane where the base substrate is located covers at least one of the second light-emitting devices in the first optical component area; and a vertical projection of the second light-shielding structure on the plane where the base substrate is located covers at least one of the second light-emitting devices in the second optical component area.

5. The display panel of claim 4, wherein
the first light-shielding structure and the second light-shielding structure are located between the base substrate and the pixel driving circuit; or
the first light-shielding structure and the second light-shielding structure are located between the light-emitting device and the pixel driving circuit; or the first light-shielding structure and the second light-shielding structure are located on a side of the light-emitting device facing away from the base substrate, and the first light-shielding structure comprises a first opening for exposing the second light-emitting device; and the second light-shielding structure comprises a second opening for exposing the second light-emitting device.

6. The display panel of claim 2, wherein the anode of the respective one of the second light-emitting devices in the first optical component area and the anode of the respective one of the second light-emitting device in the second optical component area have the same size; the anode of the respective one of the second light-emitting devices in the first optical component area comprises a first edge, and the anode of the respective one of the second light-emitting devices in the second optical component area comprises a second edge having the same size as the first edge; and
there is a first included angle between an extension direction of the first edge and an extension direction of the second edge.

7. The display panel of claim 6, wherein the first included angle ranges from 15° to 90°.

8. The display panel of claim 6, wherein the anode of the respective one of the second light-emitting devices in the first optical component area, the anode of the respective one of the second light-emitting devices in the second optical component area are rectangular, and the first included angle ranges from 30° to 70°.

9. The display panel of claim 8, wherein the first included angle is 45°.

10. The display panel of claim 6, wherein a vertical projection of the light-emitting layer of the light-emitting device on the plane where the base substrate is located is located within the anode of the light-emitting device; and
light-emitting layers of the second light-emitting devices in the first optical component area have the same size as light-emitting layers of the second light-emitting devices in the second optical component area.

11. The display panel of claim 2, wherein a shape of the anode of the respective one of the second light-emitting devices in the first optical component area is different from a shape of the anode of the respective one of the second light-emitting devices in the second optical component area.

12. The display panel of claim 2, further comprising: at least one transparent conductive layer wherein the at least one transparent conductive layer is disposed in the optical component area;
the at least one transparent conductive layer comprises: a first slit and a second slit which are disposed in pairs; a connection wire formed between the first slit and the second slit which are disposed in pairs; and an auxiliary layer located outside the first slit and the second slit which are disposed in pairs; and
pixel driving circuits of the plurality of pixels comprises first pixel driving circuits and second pixel driving circuits; the first pixel driving circuits are located in the conventional display area and is each electrically connected to a respective one of the first light-emitting devices; the second pixel driving circuits are located in the conventional display area and is each electrically connected to a respective one of the second light-emitting devices by the connection wire.

13. The display panel of claim 1, wherein a cathode in the optical component area comprises a hollow area; and a vertical projection of the hollow area on the plane where the base substrate is located is located within the first light-transmitting area and the second light-transmitting area.

14. The display panel of claim 13, wherein the optical component area comprises a plurality of first cathode blocks; each of the first cathode blocks serves as a cathode of at least one of the light-emitting devices; the plurality of first cathode blocks are disposed corresponding to the plurality of first light-shielding areas; a vertical projection of each of the plurality of first cathode blocks in the plane where the base substrate is located covers a respective one of the plurality of first light-shielding areas or a respective one of the plurality of second light-shielding areas;
vertical projections of adjacent ones of the plurality of first cathode blocks on the plane where the base substrate is located have an overlapping part; or
adjacent ones of the plurality of first cathode blocks are connected by a cathode bridge line; a vertical projection of the cathode bridge line on the plane where the base substrate is located is located in a gap area between the adjacent ones of the plurality of first cathode blocks.

15. The display panel of claim 1, wherein the display area further comprises a transition display area located between the conventional display area and the optical component area; and the light-emitting devices further comprise third light-emitting devices; and
a density of the third light-emitting devices in the transition display area is greater than a density of the second light-emitting devices in the optical component area, and is less than a density of the first light-emitting devices in the conventional display area.

16. A display panel, comprising:
a display area comprising an optical component area and a conventional display area; and
a base substrate comprising a plurality of pixels, wherein each pixel of the plurality of pixels comprises a light-emitting device and a pixel driving circuit which is electrically connected to the light-emitting device; wherein the light-emitting device comprises an anode, a light-emitting layer and a cathode disposed sequentially in a direction away from the base substrate;
wherein the light-emitting device comprises a first light-emitting device and a second light-emitting device; wherein the conventional display area comprises the first light-emitting devices arranged in an array; wherein the optical component area comprises the second light-emitting devices arranged in an array;
the optical component area comprises a first optical component area and a second optical component area; wherein the first optical component area comprises a plurality of first light-transmitting areas, a vertical projection of each of the plurality of first light-transmitting areas on a plane where the base substrate is located is located in a gap between two adjacent ones of the plurality of pixels in the first optical component area; and the second optical component area comprises a plurality of second light-transmitting areas, a vertical projection of each of the plurality of second light-transmitting areas on the plane where the base substrate is located is located in a gap between two adjacent ones of the plurality of pixels in the second optical component area; and
vertical projections of the plurality of first light-transmitting areas on the plane where the base substrate is located do not have an edge parallel to an edge of vertical projections of the plurality of second light-transmitting areas on the plane where the base substrate is located.

17. A display device, comprising:
a display panel, wherein the display panel comprises:
a display area comprising an optical component area and a conventional display area; and
a base substrate comprising a plurality of pixels, wherein each of the plurality of pixels comprises a light-emitting device and a pixel driving circuit which is electrically connected to the light-emitting device; wherein the light-emitting device comprises an anode, a light-emitting layer and a cathode disposed sequentially in a direction away from the base substrate;
light-emitting devices of the plurality of pixels comprise first light-emitting devices and second light-emitting devices; the conventional display area comprises the first light-emitting devices arranged in an array; the optical component area comprises the second light-emitting devices arranged in an array;
the optical component area comprises a first optical component area and a second optical component area; the first optical component area comprises a first light-transmitting area and a plurality of first light-shielding areas; a vertical projection of each of the plurality of first light-shielding areas on a plane where the base substrate is located covers at least one of the second light-emitting devices in the first optical component area; the second optical component area comprises a second light-transmitting area and a plurality of second light-shielding areas; a vertical projection of each of the plurality of second light-shielding areas on the plane where the base substrate is located covers at least one of the second light-emitting devices in the second optical component area; and
the plurality of first light-shielding areas in the first optical component area do not have an edge parallel to an edge of the plurality of second light-shielding areas in the second optical component area;
a first camera, which is disposed on a side of the base substrate facing away from the plurality of pixels, wherein a vertical projection of the first camera on the base substrate is located within a first optical component area, the first camera is configured to capture first image information; the first image information has a diffraction direction in a first direction, and loses a first part of image information in the first direction;
a second camera, which is disposed on the side of the base substrate facing away from the plurality of pixels; a vertical projection of the second camera on the base substrate is located within the second optical component area, the second camera is configured to capture second image information; a diffraction direction of the second image information intersects with the first direction; and a signal processing chip, which is configured to extract a first part of image information of the second image information in the first direction, and superimpose the first part of image information of the second image information on the first image information to form complete image information.

18. The display device of claim 17, further comprising: an IO interface, wherein the IO interface is electrically connected to the signal processing chip and is configured to transmit the complete image information to a main controller of the display panel.

19. The display device of claim 17, wherein each of the plurality of first light-shielding areas comprises a first light-shielding structure; an anode of a respective one of the second light-emitting devices in the first optical component area is multiplexed as the first light-shielding structure; a vertical projection of the first light-shielding structure on the plane where the base substrate is located covers the respective one of the second light-emitting devices in the first optical component area; each of the plurality of second light-shielding area comprises a second light-shielding structure; an anode of a respective one of the second light-emitting devices in the second optical component area is multiplexed as the second light-shielding structure; a vertical projection of the second light-shielding structure on the plane where the base substrate is located covers the respective one of the second light-emitting devices in the second optical component area; and the anode of the respective one of the second light-emitting devices in the first optical component area does not have an edge parallel to an edge of the anode of the respective one of the second light-emitting devices in the second optical component area.

20. The display device of claim 17, wherein first shapes of the plurality of first light-shielding areas comprise at least one of a regular triangle, a rectangle, a parallelogram, a regular pentagon, a regular hexagon or a trapezoid, and second shapes of the plurality of second light-shielding areas comprise light-shielding at least one of a regular triangle, a rectangle, a parallelogram, a regular pentagon, a regular hexagon or a trapezoid.

* * * * *